(12) United States Patent
Kikuchi

(10) Patent No.: US 7,561,150 B2
(45) Date of Patent: Jul. 14, 2009

(54) LIQUID CRYSTAL DRIVING CIRCUIT AND LIQUID CRYSTAL DISPLAY DEVICE

(75) Inventor: Koji Kikuchi, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 719 days.

(21) Appl. No.: 11/228,440

(22) Filed: Sep. 15, 2005

(65) Prior Publication Data
US 2006/0071890 A1   Apr. 6, 2006

(30) Foreign Application Priority Data
Oct. 6, 2004   (JP)   ............... 2004-293496

(51) Int. Cl.
G09G 5/00   (2006.01)
(52) U.S. Cl. .............. 345/204; 345/205; 345/206; 345/207; 345/214; 377/64; 377/70
(58) Field of Classification Search ............ 345/61, 345/87, 98–100; 377/70–81
See application file for complete search history.

(56) References Cited

U.S. PATENT DOCUMENTS

| | | | |
|---|---|---|---|
| 5,151,689 A * | 9/1992 | Kabuto et al. ............... 345/103 |
| 5,192,945 A | 3/1993 | Kusada | |
| 6,437,767 B1 * | 8/2002 | Cairns et al. ............... 345/100 |
| 6,496,169 B1 * | 12/2002 | Mametsuka ............... 345/87 |
| 7,006,068 B2 * | 2/2006 | Haga ............... 345/98 |
| 7,106,316 B2 * | 9/2006 | Tanaka ............... 345/204 |
| 2004/0008170 A1 * | 1/2004 | Makino et al. ............... 345/87 |
| 2004/0257322 A1 * | 12/2004 | Moon ............... 345/87 |

FOREIGN PATENT DOCUMENTS

| | | |
|---|---|---|
| EP | 1492078 A2 * | 12/2004 |
| JP | 5-46123 | 2/1993 |

* cited by examiner

Primary Examiner—Richard Hjerpe
Assistant Examiner—Gregory J Tryder
(74) Attorney, Agent, or Firm—Beyer Law Group LLP

(57) ABSTRACT

As multiphase clocks to be supplied to a first gate driver that drives odd-numbered scanning lines in a liquid crystal display region and a second gate driver that drives even-numbered scanning lines, clocks, which are effective within an effective period of the image signal just before an image signal starts to be supplied to display elements for each scanning line of the liquid crystal display region, is generated and the first and second gate drivers drive switching elements in the effective period of the clock.

4 Claims, 6 Drawing Sheets

LIQUID CRYSTAL DRIVING CIRCUIT AND LIQUID CRYSTAL DISPLAY DEVICE

BACKGROUND OF THE INVENTION

1. Field of the Invention

The present invention relates to a liquid crystal display device, and more particularly, to a liquid crystal driving circuit.

2. Description of the Related Art

As for a driving circuit of a liquid crystal display device according to the related art, for example, a technology disclosed in JP-A-5-46123 (pages 2 to 3 and FIG. 1) has been known. According to the related art technology, in a liquid crystal display device in which an active matrix-type liquid crystal panel is driven to display, a first gate driver that sequentially drives odd-numbered scanning lines of the liquid crystal panel and a second gate driver that sequentially drives even-numbered scanning lines are provided. Accordingly, the odd-numbered scanning lines and the even-numbered scanning lines of the liquid crystal panel are scanned by the first and second gate drivers, respectively, and thus scanning time of each scanning becomes twice as much as the related art. Therefore, even when the number of scanning lines is increased, sufficient writing time of liquid crystal is ensured.

In the above-described related art technology, however, pulses (source pulses) of image signals to be supplied to display elements corresponding to pixels on the liquid crystal panel and pulses (gate pulses) for writing the image signals into the display elements become effective with same timing. Accordingly, when the liquid crystal panel is driven to display at high speed, if the width of the source pulse is decreased, the width of the gate pulse is decreased accordingly, which causes insufficient writing time of liquid crystal. For this reason, even when the number of scanning lines is increased for the sake of the large pixels of the liquid crystal display device, the liquid crystal panel is difficult to be driven to display at high speed. As a result, sufficient display performance cannot be ensured.

In particular, in a case in which TFTs (thin film transistors) on an active matrix substrate of a liquid crystal display device are made of amorphous silicon (a-Si) having low mobility, and the gate drivers are built in the active matrix substrate by use of the TFTs, the above-described problem drastically occurs. Further, at the worst, with the decrease of the width of the gate pulse, the gate driver may be disabled. Amorphous silicon (a-Si) is attracting attention because of a manufacturing process at low costs. Accordingly, it is important to allow the liquid crystal panel to be driven to display at high speed and to implement the large pixels of the liquid crystal display device.

SUMMARY OF THE INVENTION

The invention has been made in view of the above-described problems, and it is an object of the invention to provide a liquid crystal driving circuit which can drive an active matrix-type liquid crystal panel to display at high speed, and a liquid crystal display device.

In order to achieve the above-described object, according to an aspect of the invention, there is provided a liquid crystal driving circuit for a liquid crystal display device, in which an active matrix-type liquid crystal display region and gate drivers for driving switching elements, which perform switching to cause display elements formed in the liquid crystal display region to hold an image signal supplied from a source driver, are formed with the same manufacturing process as that of amorphous silicon thin film transistors. The liquid crystal driving circuit includes a first gate driver that drives odd-numbered scanning lines in the liquid crystal display region, a second gate driver that drives even-numbered scanning lines in the liquid crystal display region, and a clock generation circuit that generates multiphase clocks, which are supplied to the first and second gate drivers. The multiphase clocks become effective within an effective period of the image signal just before the image signal start to be supplied to the display elements for each scanning line of the liquid crystal display region, and the first and second gate drivers drive the switching elements in the effective period of the clock supplied from the clock generation circuit.

According to this configuration, since the display elements start to be driven just before the source pulse (image signal) to be written is supplied to the display elements, sufficient writing time of the source pulse into the display elements can be ensured, and thus the active matrix-type liquid crystal panel can be driven to display at high speed. Further, the sufficient width of the gate pulse can be ensured and the gate drivers can be stably operated.

In the liquid crystal driving circuit according to the aspect of the invention, the clock generation circuit may generate a first control pulse for controlling driving of the odd-numbered scanning lines in the liquid crystal display region and a second control pulse for controlling driving of the even-numbered scanning lines. Further, the first gate driver may start to drive the switching elements based on the first control pulse, and the second gate driver may start to drive the switching elements based on the second control pulse.

According to this configuration, display driving for the odd-numbered scanning lines is controlled based on the first control pulse, and display driving for the even-numbered scanning lines is controlled based on the second control pulse. Therefore, the odd-numbered scanning lines and the even-numbered scanning lines can be optimally controlled, respectively, and display operation performance of the liquid crystal display device can be enhanced.

According to another aspect of the invention, there is provided a liquid crystal display device, in which an active matrix-type liquid crystal display region and gate drivers for driving switching elements, which perform switching to cause display elements formed in the liquid crystal display region to hold an image signal supplied from a source driver, are formed with the same manufacturing process as that of amorphous silicon thin film transistors. The liquid crystal display device includes a first gate driver that drives odd-numbered scanning lines in the liquid crystal display region, a second gate driver that drives even-numbered scanning lines in the liquid crystal display region, and a clock generation circuit that generates multiphase clocks, which are supplied to the first and second gate drivers. The multiphase clocks become effective within an effective period of the image signal just before the image signal starts to be supplied to the display elements for each scanning line of the liquid crystal display region, and the first and second gate drivers drive the switching elements in the effective period of the clock supplied from the clock generation circuit.

In the liquid crystal display device according to another aspect of the invention, the clock generation circuit may generate a first control pulse for controlling driving of the odd-numbered scanning lines in the liquid crystal display region and a second control pulse for controlling driving of the even-numbered scanning lines. Further, the first gate driver may start to drive the switching elements based on the first control pulse, and the second gate driver may start to drive the switching elements based on the second control pulse.

DESCRIPTION OF THE PREFERRED EMBODIMENT

Hereinafter, an embodiment of the invention will be described with reference to the drawings.

Figure 1:
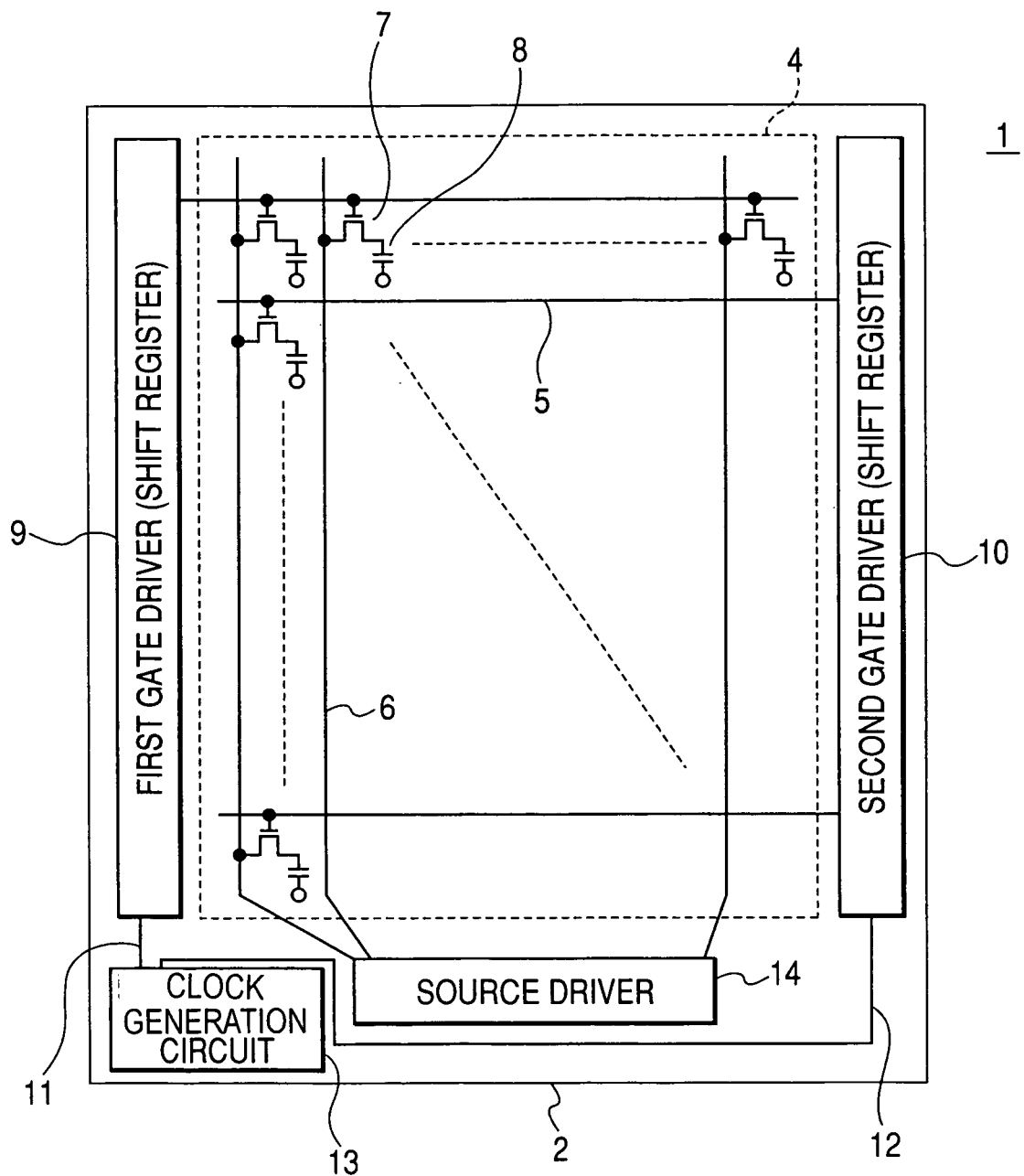
FIG. 1 is a block diagram showing a configuration of a liquid crystal display device 1 according to an embodiment of the invention.

FIG. 1 is a block diagram showing the configuration of a liquid crystal display device 1 according to an embodiment of the invention. In FIG. 1, the liquid crystal display device 1 has an active matrix-type liquid crystal panel (a liquid crystal display region). A display region 4 is formed by injecting liquid crystal between a TFT array substrate 2 and a counter substrate (not shown) provided at a position facing the TFT array substrate 2. The counter substrate has a common electrode (not shown). In the display region 4, display elements 8 are capacitive elements, which are formed by liquid crystal injected between pixel electrodes (not shown) of the TFT array substrate 2 and the common electrode of the counter substrate.

On the TFT array substrate 2, a plurality of scanning lines 5 and a plurality of signal lines 6 are disposed in a matrix shape. Further, in the display region 4, TFTs 7 serving as switching elements and the pixel electrodes are formed to be disposed at intersections of the scanning lines 5 and the signal lines 6.

Further, on the TFT array substrate 2, a first gate driver 9 and a second gate driver 10 are formed along two sides outside the display region 4, respectively. The first gate driver 9 is connected to odd-numbered scanning lines 5. The first gate driver 9 outputs gate pulses for sequentially driving the odd-numbered scanning lines 5 to the odd-numbered scanning lines 5. The second gate driver 10 is connected to even-numbered scanning lines 5. The second gate driver 10 outputs gate pulses for sequentially driving the even-numbered scanning lines 5 to the even-numbered scanning lines 5. The first and second gate drivers 9 and 10 have shift registers.

A clock generation circuit 13 and a source driver 14 have ICs and are mounted on the TFT array substrate 2 by use of a COG (Chip On Glass) technology. The source driver 14 is connected to the signal lines 6. The source driver 14 outputs source pulses to the signal lines 6, and then the source pulses are supplied to the display elements 8.

Further, a first signal supply source 11 and a second signal supply source 12, which supply signals from the clock generation circuit 13 to the first and second gate drivers 9 and 10, respectively, are formed on the TFT array substrate 2.

On the above-described TFT array substrate 2, the TFTs 7 in the display region 4 are formed with a manufacturing process for forming a-Si TFTs. Further, the first and second gate drivers 9 and 10 are formed by the same manufacturing process as that of the TFTs 7 in the display region 4.

Moreover, the clock generation circuit 13 and the source driver 14 may be provided outside the TFT array substrate 2 and may be connected to a first clock signal line 11, a second clock signal line 12, and the signal lines so as to supply signals thereto, respectively. For example, the clock generation circuit 13 and the source driver 14 may be connected to the TFT array substrate 2 with a flexible cable, a FPC (Flexible Printed Circuit), or a COF (Chip On Flexible film).

Figure 2:
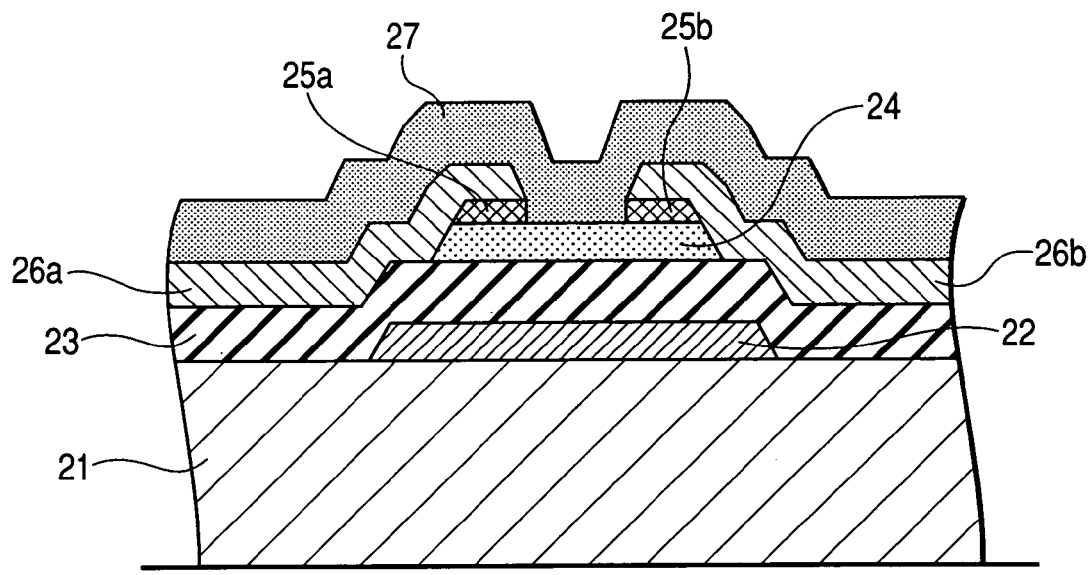
FIG. 2 is a diagram showing a cross-section of a switching element of an a-Si TFT.

FIG. 2 is a diagram showing a cross-section of a switching element of an a-Si TFT. The switching elements (the TFTs 7) in the display region 4 and the gate drivers 9 and 10 shown in FIG. 1 have the TFTs of FIG. 2.

As shown in FIG. 2, in the switching element of the a-Si TFT, a gate electrode 22 is formed on a top surface of a transparent substrate 21. On the substrate 21 and the gate electrode 22, a gate insulating film 23 is formed to cover them. On the gate insulating film 23, an a-Si (i) film (an intrinsic amorphous silicon film) 24, which is a semiconductor film on an island, is formed. Further, on the a-Si (i) film 24, a-Si (n+) films (amorphous silicon films in which impurity ions are doped) 25a and 25b are formed as semiconductor films. On the gate insulating film 23 and the a-Si (n+) films 25a and 25b, a source electrode 26a and a drain electrode 26b are formed. Then, on the gate insulting film 23, the a-Si (i) film 24, the a-Si (+) films 25a and 25b, the source electrode 26a, and the drain electrode 26b, a protective film 27 is formed to cover them.

In FIG. 2, the source electrode 26a and the drain electrode 26b are formed of the same film with the same process. Further, as shown in FIG. 1, in the a-Si TFT shown in FIG. 2, the gate electrode 22 is connected to the scanning line 5, the source electrode 26a is connected to the signal line 6, and the drain electrode 26b is connected to one electrode of the display element 8.

Figure 3:
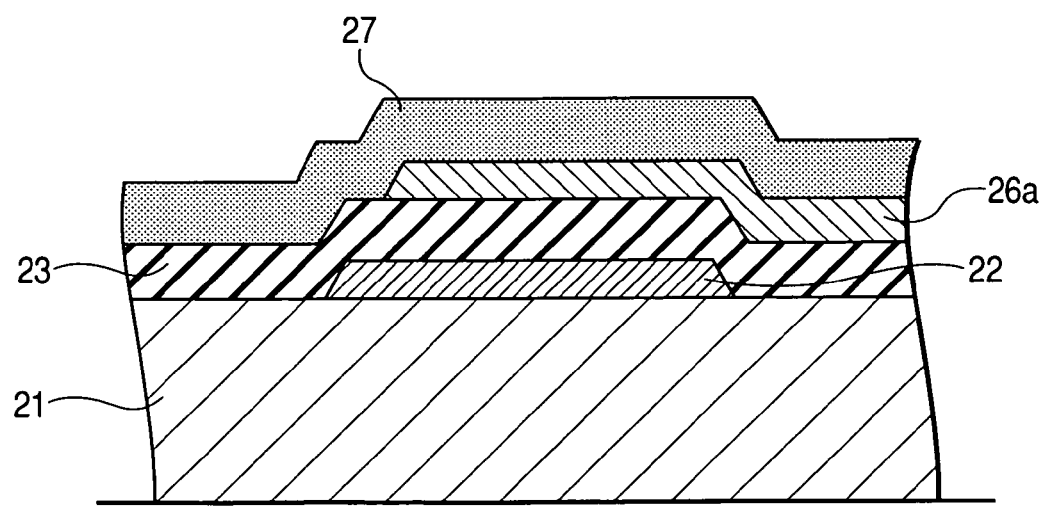
FIG. 3 is a diagram showing a cross-section of a capacitive element formed with the same process as FIG. 2.

FIG. 3 is a diagram showing a cross-section of a capacitive element formed with the same process as FIG. 2. The capacitive element is provided for each shift register constituting the gate drivers 9 and 10 shown in FIG. 1. In FIG. 3, the capacitive element is constituted by the gate electrode 22, the source electrode 26a, and the drain electrode 26b formed on the substrate 21.

Figure 4:
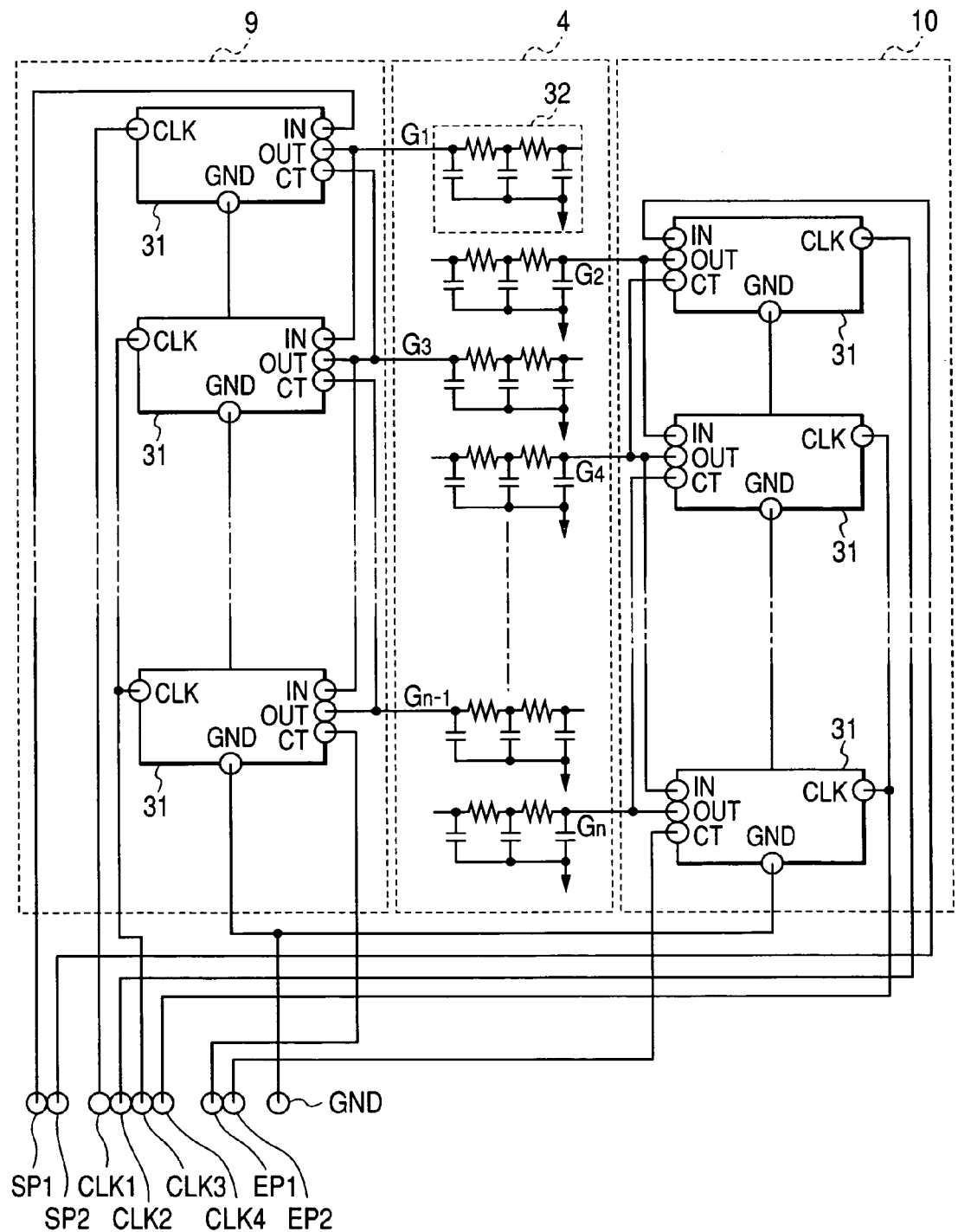
FIG. 4 is a block diagram showing a configuration of gate drives 9 and 10 and scanning lines 5 of a display region 4 in the liquid crystal display device 1 shown in FIG. 1.

FIG. 4 is a block diagram showing the configuration of the gate drivers 9 and 10 and the scanning lines 5 of the display region 4 in the liquid crystal display device 1 shown in FIG. 1.

In FIG. 4, each of the gate drivers 9 and 10 has the configuration of a shift register in which a plurality of register circuits 31 are connected in multistage wise. A gate delay circuit 32 is an equivalent circuit of resistive and capacitive components of the scanning line 5 of FIG. 1.

To the first gate driver 9, a start pulse SP1, clocks CLK1 and CLK3, an end pulse EP1, and a ground signal GND are inputted from the clock generation circuit 13 via the first signal supply line 11. To the second gate driver 10, a start pulses SP2, clocks CLK2 and CLK4, an end pulse EP2, and a ground signal GND are inputted from the clock generation circuit 13 via the second signal supply line 12. The start pulses SP1 and SP2, the clocks CLK1 to CLK4, and the end pulses EP1 and EP2 have waveforms shown in FIG. 7.

In each of the gate drivers 9 and 10, an output signal (gate pulse G) of one register circuit 31 is inputted to a next-stage register circuit 31 and simultaneously to a previous-state register circuit 31 as a control signal CT. To the first register circuits 31 of the gate drivers 9 and 10, the start pulses SP1 and SP2 are inputted, respectively. Further, to the final register circuits 31 of the gate drivers 9 and 10, the end pulses EP1 and EP2 are inputted, respectively.

Figure 5:
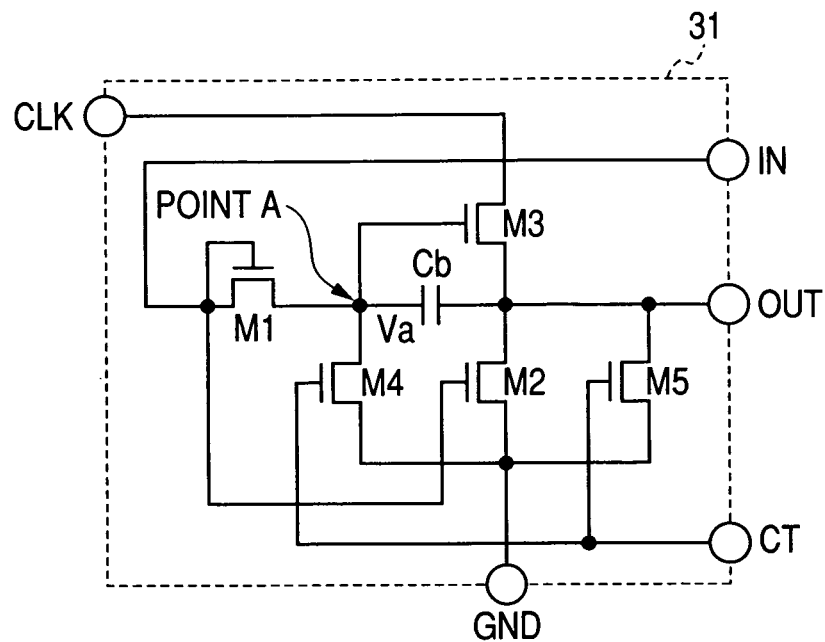
FIG. 5 is a diagram showing an internal configuration of a register circuit 31 shown in FIG. 4.

FIG. 5 is a diagram showing the internal configuration of the register circuit 31 shown in FIG. 4.

In FIG. 5, transistors M1 to M5 are a-Si TFTs shown in FIG. 2. Further, a capacitor Cb is the capacitive element shown in FIG. 3. An input terminal IN is connected to the gate of the transistor M1, of which the gate and the drain are connected to each other, and to the gate of the transistor M2. The source of the transistor M1 is connected to a node A. In the transistor M2, the drain is connected to an output terminal OUT, and the source is connected to a ground terminal GND. In the transistor M3, the gate is connected to the node A, the drain is connected to a clock input terminal CLK, and the source is connected to the output terminal OUT.

A control signal input terminal CT is connected to the gate of the transistor M4 and the gate of the transistor M5. In the transistor M4, the drain is connected to the node A, and the source is connected to the ground terminal GND. In the transistor M5, the drain is connected to the output terminal OUT, and the source is connected to the ground terminal GND. One end of the capacitor Cb is connected to the node A and the other end thereof is connected to the output terminal OUT.

Figure 6:
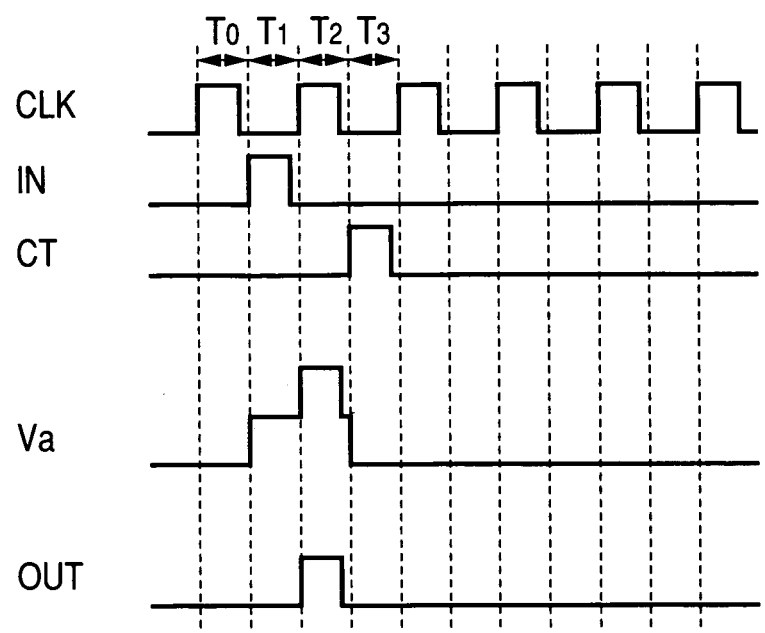
FIG. 6 is a timing chart illustrating an operation of the register circuit 31 shown in FIG. 5.

FIG. 6 is a timing chart illustrating the operation of the register circuit 31 shown in FIG. 5.

Referring to FIG. 6, the operation of the register circuit 31 shown in FIG. 5 will be described.

First, in a period T0, the voltage Va of the node A is L (Low level), and the output voltage of the output terminal OUT is L. In a next period T1, the voltage applied to the input terminal IN is H (Hi level) for a constant period, and thus the transistors M1 and M2 are turned on. At this time, the voltage on one end of the capacitor Cb becomes the H voltage equal to that of the input terminal IN with the transistor M1, and the voltage of the other end of the capacitor Cb becomes the L voltage equal to that of the ground terminal GND with the transistor M2.

Next, at the last half timing of the period T1, the voltage on the input terminal IN becomes L, but, in the capacitor Cb, an electric charge is charged. At this time, since the voltage Va on the node A is H, the transistor M3 is turned on. However, since the voltage on the clock terminal CLK is L, the output voltage of the output terminal OUT is maintained at L.

Next, in the next period T2, the voltage applied to the clock input terminal CLK becomes H for a constant period. In this case, the transistors M1 and M2 are turned off and the transistor M3 is maintained to be turned on. Therefore, the output voltage on the output terminal OUT becomes H equal to the voltage of the clock input terminal CLK. The voltage Va on the node A at this time is raised by twice as much as H (boot strap). Therefore, the transistor M3 operates in a state in which the on state is stronger. At the last half timing of the period T2, if the voltage on the clock input terminal CLK becomes L, the output voltage of the output terminal OUT becomes L, such that the voltage on the node A returns to the electric potential of H.

Next, in a next period T3, the voltage applied to the control signal input terminal CT becomes H for a constant period. Accordingly, if the transistors M4 and M5 are turned on, one end of the capacitor Cb becomes the voltage of L equal to that of the ground terminal GND with the transistor M4 and the other end of the capacitor Cb becomes the voltage of L equal to that of the ground terminal GND with the transistor M5. Therefore, the electric charge charged in the capacitor Cb is discharged. As a result, the state in a period subsequent to the period T3 is reset to the same state as that in the period T0.

Figure 7:
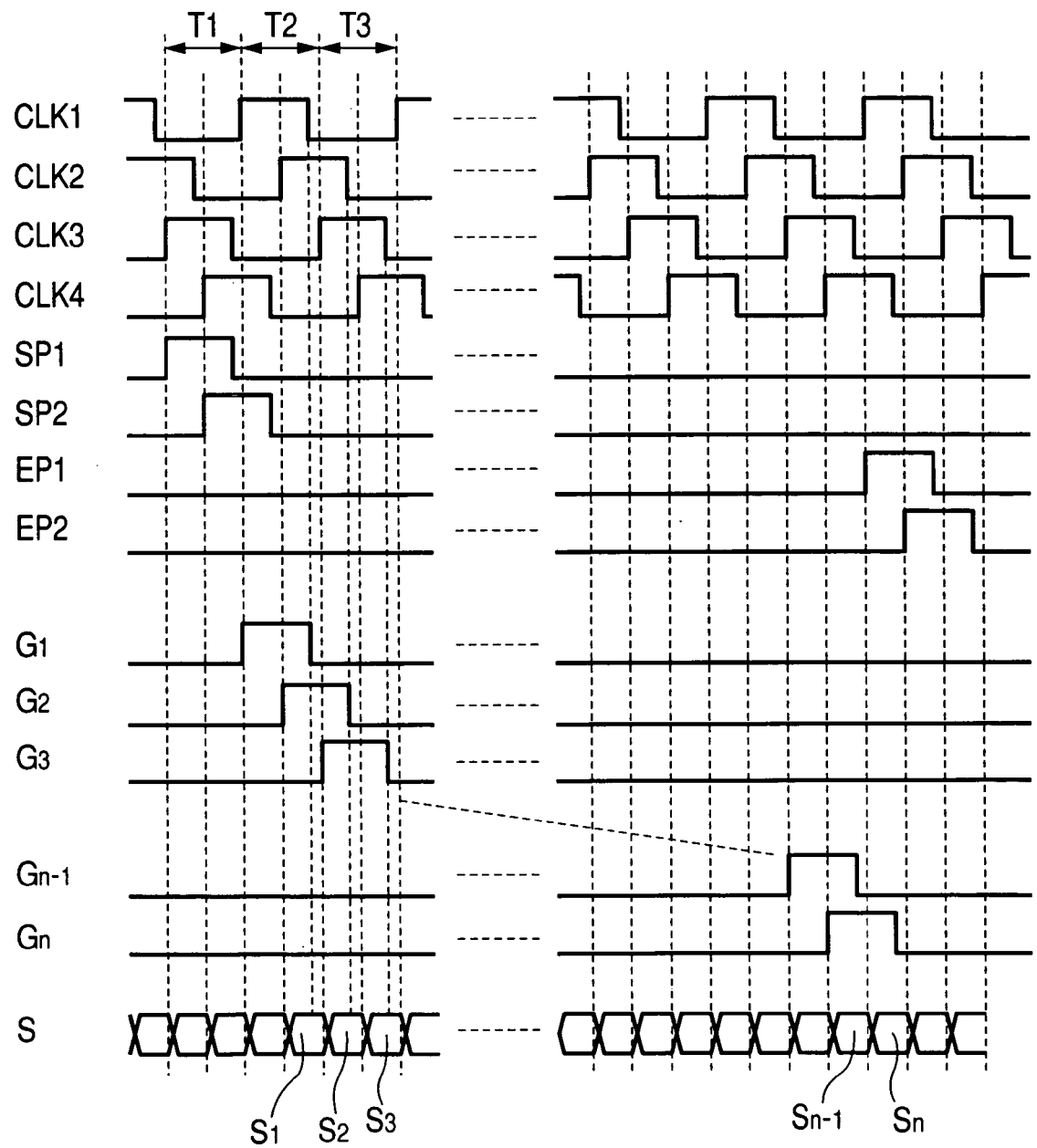
FIG. 7 is a timing chart illustrating display driving operations of the first and second gate drivers 9 and 10 shown in FIG. 4.

FIG. 7 is a timing chart illustrating the display driving operations of the first and second gate drivers 9 and 10 shown in FIG. 4.

Referring to FIG. 7, the display driving operation of each of the first and second gate drivers 9 and 10 shown in FIG. 4 will be described. Here, the operation of the first gate driver 9 will be described as an example. The operation of the second gate driver 10 is the same as that of the first gate driver 9 and thus the description thereof will be omitted.

When the start pulse SP1 is inputted to the first gate driver 9, the voltage on the input terminal IN of the first register circuit 31 becomes H. The state at this time corresponds to the state in the period T1 shown in FIG. 6. In FIG. 7, the periods T1, T2, and T3 in the first gate driver 9 are shown.

Next, in the period T2, when the clock CLK1 becomes H, the voltage on the clock input terminal CLK of the first register circuit 31 becomes H, and thus the voltage of H, that is, the gate pulse G1, is outputted from the output terminal OUT of the first register circuit 31. The gate pulse G1 becomes H (effective) in the same period as the period (effective period) in which the clock CLK1 is H.

With the gate pulse G1, the first scanning line 5 is driven. At this time, the source pulse S1 to be supplied from the source driver 14 to the signal lines 6 is held in the display elements 8 on the first scanning line 5. Holding the pulse in the display elements 8 is completed by falling of the gate pulse G1 from H to L. Therefore, falling timing of the clock CLK1 from H to L is set within the effective period of the source pulse S1, S5, S9, . . . to be written into the display elements 6 of the scanning line 5 to be driven, as shown in FIG. 7. On the other hand, rising timing of the clock CLK1 from L to H is set just before the source pulse starts to be supplied, as shown in FIG. 7. In the example shown in FIG. 7, rising timing of the clock CLK1 is set so as to become H (effective) just before one width of the source pulse. For this reason, sufficient writing time of the source pulse into the display elements 8 can be ensured. Therefore, in a case of performing display driving at high speed, even when the width of the source pulse is decreased, the source pulse can be held in the display elements 8 without any problem.

Similarly, the third register 31 outputs the gate pulse G3 in a period when the clock CLK3 is H, as shown in FIG. 7. Falling timing of the clock CLK3 from H to L is set within the effective period of the source pulse S3, S7, S11, . . . to be written into the display elements 6 of the scanning line 5 to be driven, as shown in FIG. 7. On the other hand, rising timing of the clock CLK3 from L to H is set just before the source pulse starts to be supplied (just before one width of the source pulse, in the example shown in FIG. 7).

As described above, according to this embodiment, since the display elements are driven just before the source pulse to be written in the display elements starts to be supplied, sufficient writing time of the source pulse into the display elements can be ensured, and thus the active matrix-type liquid crystal panel can be driven to display at high speed. Therefore, in a case of performing display driving at high speed, even when the width of the source pulse is decreased, the source pulse can be held in the display elements without any problem. As a result, sufficient display performance can be ensured.

Further, amorphous silicon (a-Si), which is attracting attention as the manufacturing process at low cost, is widely-applied to various liquid crystal display devices.

Figure 8:
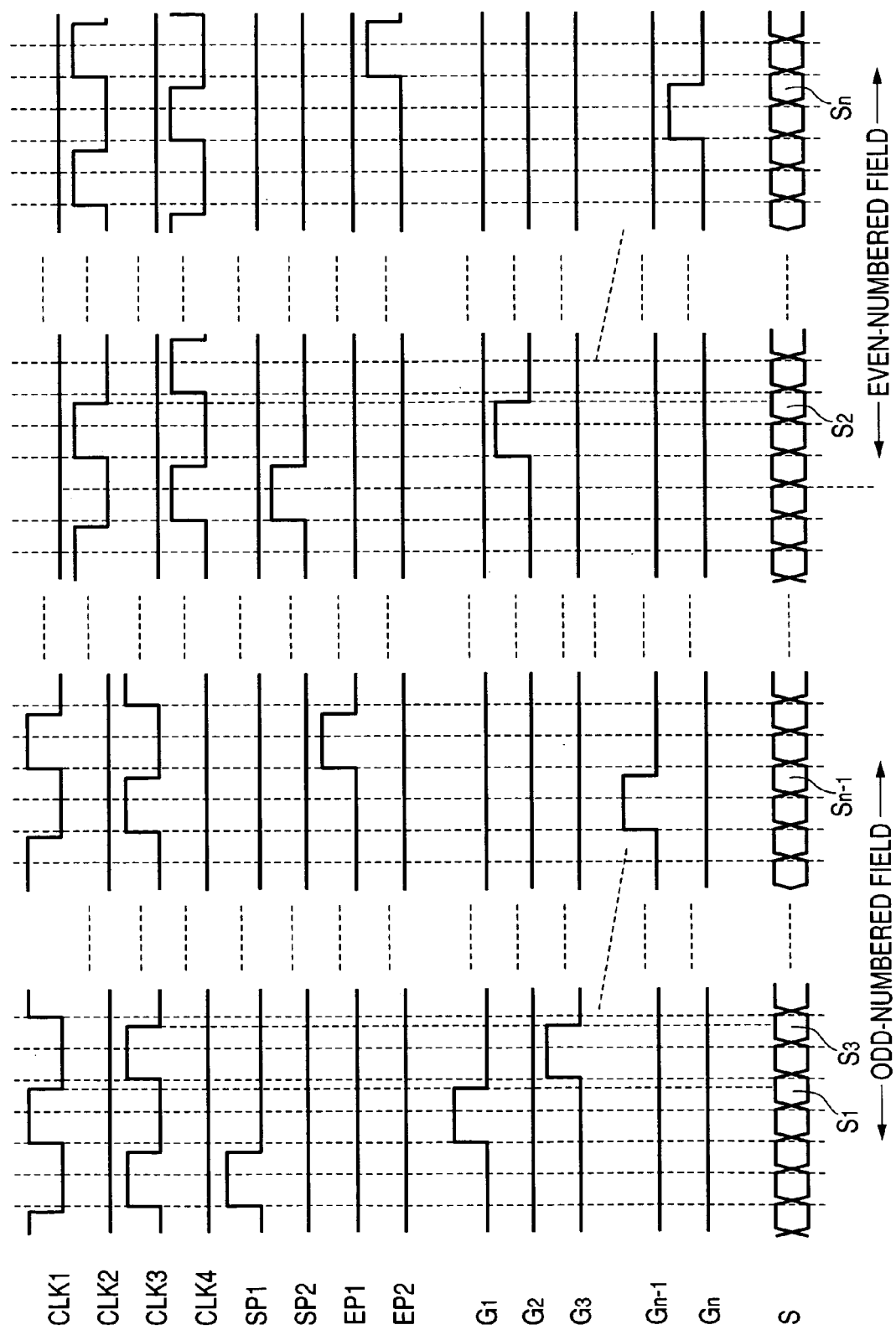
FIG. 8 is a timing chart illustrating another example of display driving operations of the first and second gate drivers 9 and 10 shown in FIG. 4.

Moreover, as an application of this embodiment, as shown in FIG. 8, interlaced driving can be performed. In FIG. 8, after display driving of an odd-numbered field is completed by the first gate driver 9 that drives the odd-numbered scanning lines 5, display driving of an even-numbered field starts by the second gate driver 10 that drives the even-numbered scanning lines 5. Then, after display driving of the even-numbered field is completed by the second gate driver 10, display driving of a next odd-numbered field starts by the first gate driver 9. Specifically, after the end pulse EP1 is inputted to the first gate driver 9, the start pulse SP2 is inputted to the second gate driver 10. Then, after the end pulse EP1 is inputted to the second gate driver 10, the start pulse SP1 is inputted to the first gate driver 9.

The embodiment according to the invention has been described with reference to the drawings. However, the invention is not limited to the above embodiment, and various changes or modifications can be made without departing from the scope of the invention.

According to the invention, since the display elements start to be driven just before the source pulse (image signal) to be written starts to be supplied to the display elements, sufficient writing time of the source pulse into the display elements can be ensured, and thus the active matrix-type liquid crystal panel can be driven to display at high speed. Therefore, even when the number of scanning lines is increased for the sake of the large pixels of the liquid crystal display device and even when the width of the source pulse is decreased in order to perform display driving at high speed, the source pulse can be held in the display elements without any problem. As a result, sufficient display performance can be ensured. Further, the sufficient width of the gate pulse can be ensured and the gate drivers can be stably operated.

The invention claimed is:

1. A liquid crystal driving circuit for a liquid crystal display device, the liquid crystal display device including: an active matrix-type liquid crystal display region; display elements formed in the liquid crystal display region; switching elements to perform switching to cause the display elements to hold an image signal, each of the switching elements including an amorphous silicon thin film transistor, said driving circuit comprising:

a first gate driver that drives the switching element on odd-numbered scanning lines in the liquid crystal display region;

a second gate driver that drives the switching elements on even-numbered scanning lines in the liquid crystal display region;

a source driver that supplies source pulses as the image signal to the display elements via the corresponding switching elements, the source pulses having a first pulse width during which the image signal is active high; and a clock generation circuit that generates multiphase clock signals in a form of clock pulses having a second pulse width, the clock signals being active high during the second pulse width, the clock signals being supplied to the first and second gate drivers, wherein the multiphase clock signals become active high one first pulse width before the image signal to be supplied to the display elements becomes active high, a falling of the clock pulse being set within an active high period of the corresponding source pulse, and the first and second gate drivers drive the switching elements in the active high period of the clock signals.

2. The liquid crystal driving circuit according to claim 1, wherein the clock generation circuit generates a first clock pulse for controlling driving of the odd-numbered scanning lines in the liquid crystal display region and a second clock pulse for controlling driving of the even-numbered scanning lines, the first gate driver starts to drive the switching elements based on the first clock pulse, and the second gate driver starts to drive the switching elements based on the second clock pulse.

3. A liquid crystal display device, the liquid crystal display device including: an active matrix-type liquid crystal display region; display elements formed in the liquid crystal display region; switching elements to perform switching to cause the display elements to hold an image signal, each of the switching elements including an amorphous silicon thin film transistor, said liquid crystal display device comprising:

a first gate driver that drives the switching element on odd-numbered scanning lines in the liquid crystal display region;

a second gate driver that drives the switching elements on even-numbered scanning lines in the liquid crystal display region;

a source driver that supplies source pulses as the image signal to the display elements via the corresponding switching elements, the source pulses having a first pulse width during which the image signal is active high; and a clock generation circuit that generates multiphase clock signals in a form of clock pulses having a second pulse width, the clock signals being active high during the second pulse width, the clock signals being supplied to the first and second gate drivers, wherein the multiphase clock signals become active high one first pulse width before the image signal to be supplied to the display elements becomes active high, a falling of the clock pulse being set within an active high period of the corresponding source pulse, and the first and second gate drivers drive the switching elements in the active high period of the clock signals.

4. The liquid crystal display device according to claim 3, wherein the clock generation circuit generates a first clock pulse for controlling driving of the odd-numbered scanning lines in the liquid crystal display region and a second clock pulse for controlling driving of the even-numbered scanning lines, the first gate driver starts to drive the switching elements based on the first clock pulse, and the second gate driver starts to drive the switching elements based on the second clock pulse.

* * * * *